United States Patent
Pan et al.

(10) Patent No.: US 11,056,434 B2
(45) Date of Patent: Jul. 6, 2021

(54) SEMICONDUCTOR DEVICE HAVING SPECIFIED P-TYPE DOPANT CONCENTRATION PROFILE

(71) Applicant: EPISTAR CORPORATION, Hsinchu (TW)

(72) Inventors: Yung-Chung Pan, Hsinchu (TW); Chang-Yu Tsai, Hsinchu (TW); Ching-Chung Hu, Hsinchu (TW); Ming-Pao Chen, Hsinchu (TW); Chi Shen, Hsinchu (TW); Wei-Chieh Lien, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 251 days.

(21) Appl. No.: 15/875,735

(22) Filed: Jan. 19, 2018

(65) Prior Publication Data
US 2018/0211919 A1    Jul. 26, 2018

Related U.S. Application Data

(60) Provisional application No. 62/450,824, filed on Jan. 26, 2017.

(51) Int. Cl.
*H01L 33/04* (2010.01)
*H01L 33/14* (2010.01)
(Continued)

(52) U.S. Cl.
CPC .... *H01L 23/53223* (2013.01); *H01L 21/0254* (2013.01); *H01L 21/02458* (2013.01);
(Continued)

(58) Field of Classification Search
CPC ..... H01L 33/305; H01L 33/32; H01L 33/325; H01L 31/03042; H01L 31/03046;
(Continued)

(56) References Cited

U.S. PATENT DOCUMENTS

| | | | | |
|---|---|---|---|---|
| 4,506,366 A | * | 3/1985 | Chinone | H01S 5/16 372/45.01 |
| 6,351,479 B1 | * | 2/2002 | Mori | H01L 33/305 372/45.01 |

(Continued)

FOREIGN PATENT DOCUMENTS

JP    6092961 B2    3/2017

*Primary Examiner* — Eduardo A Rodela
*Assistant Examiner* — Christopher M Roland
(74) *Attorney, Agent, or Firm* — Ditthavong, Steiner & Mlotkowski

(57) ABSTRACT

A semiconductor device comprises: a first semiconductor structure; a second semiconductor structure on the first semiconductor structure; an active region, wherein the active region comprises multiple alternating well layers and barrier layers, the active region further comprises an upper surface facing the second semiconductor structure and a bottom surface opposite the upper surface; an electron blocking region between the second semiconductor structure and the active region; a first aluminum-containing layer between the electron blocking region and the active region, wherein the first aluminum-containing layer has a band gap greater than the band gap of the first electron blocking layer; and a p-type dopant above the bottom surface of the active region and comprising a concentration profile comprising a peak shape having a peak concentration value, wherein the peak concentration value lies at a distance of between 15 nm and 60 nm from the upper surface of the active region.

19 Claims, 10 Drawing Sheets

(51) Int. Cl.
| | |
|---|---|
| *H01L 33/26* | (2010.01) |
| *H01L 23/532* | (2006.01) |
| *H01L 33/12* | (2010.01) |
| *H01L 33/28* | (2010.01) |
| *H01L 21/02* | (2006.01) |
| *H01L 21/285* | (2006.01) |
| *H01L 21/768* | (2006.01) |
| *H01L 33/32* | (2010.01) |
| *H01L 33/06* | (2010.01) |
| H01L 31/0304 | (2006.01) |
| H01L 29/205 | (2006.01) |
| H01L 33/30 | (2010.01) |

(52) U.S. Cl.
CPC .. *H01L 21/02579* (2013.01); *H01L 21/28575* (2013.01); *H01L 21/76846* (2013.01); *H01L 33/04* (2013.01); *H01L 33/06* (2013.01); *H01L 33/12* (2013.01); *H01L 33/14* (2013.01); *H01L 33/145* (2013.01); *H01L 33/28* (2013.01); *H01L 33/32* (2013.01); *H01L 29/205* (2013.01); *H01L 31/03042* (2013.01); *H01L 31/03046* (2013.01); *H01L 33/305* (2013.01); *H01L 33/325* (2013.01)

(58) Field of Classification Search
CPC ........... H01L 21/02458; H01L 21/0254; H01L 21/02579; H01L 21/28575; H01L 21/76846; H01L 23/53223; H01L 29/205; H01L 33/04; H01L 33/06; H01L 33/12; H01L 33/14; H01L 33/145; H01L 33/38

See application file for complete search history.

(56) References Cited

U.S. PATENT DOCUMENTS

| | | | |
|---|---|---|---|
| 7,812,366 B1 | 10/2010 | Sampath et al. | |
| 9,000,460 B2 | 4/2015 | Kim et al. | |
| 9,281,437 B2 | 3/2016 | Kim et al. | |
| 2009/0206741 A1* | 8/2009 | Yoon | B82Y 10/00 313/504 |
| 2010/0032649 A1* | 2/2010 | Lin | H01L 33/04 257/13 |
| 2010/0290497 A1* | 11/2010 | Freund | H01S 5/305 372/50.1 |
| 2012/0012815 A1* | 1/2012 | Moon | H01L 33/06 257/13 |
| 2013/0075696 A1* | 3/2013 | Hsieh | H01L 33/06 257/13 |
| 2013/0146842 A1* | 6/2013 | Kim | H01L 33/06 257/13 |
| 2014/0103290 A1* | 4/2014 | Yen | H01L 33/06 257/13 |
| 2015/0021652 A1* | 1/2015 | Ueta | H01L 33/16 257/103 |
| 2015/0097233 A1* | 4/2015 | Zundel | H01L 29/105 257/334 |
| 2015/0214422 A1* | 7/2015 | Kim | H01L 33/145 257/13 |
| 2016/0005919 A1* | 1/2016 | Obata | H01L 33/0025 257/13 |
| 2016/0329463 A1* | 11/2016 | Freund | H01L 21/02579 |
| 2017/0104128 A1* | 4/2017 | Yeh | H01L 33/12 |
| 2018/0351039 A1* | 12/2018 | Kim | H01L 33/325 |
| 2019/0006558 A1* | 1/2019 | Watanabe | H01L 33/06 |
| 2019/0312178 A1* | 10/2019 | Obata | H01L 33/04 |

\* cited by examiner

SEMICONDUCTOR DEVICE HAVING SPECIFIED P-TYPE DOPANT CONCENTRATION PROFILE

CROSS REFERENCE TO RELATED APPLICATIONS

This application claims the benefit of U.S. Provisional Application Ser. No. 62/450,824, filed on Jan. 26, 2017, the entire content of which is hereby incorporated by reference.

TECHNICAL FIELD

The disclosure relates to a semiconductor device, and particularly to a semiconductor device comprising an aluminum-containing layer.

DESCRIPTION OF BACKGROUND ART

Light-emitting diodes (LEDs) are widely used as solid-state light sources. Compared to conventional incandescent light lamps or fluorescent light tubes, LEDs have advantages such as lower power consumption and longer lifetime, and therefore LEDs gradually replace the conventional light sources and are applied to various fields such as traffic lights, back light modules, street lighting, and biomedical device.

SUMMARY OF THE DISCLOSURE

The present disclosure provides a semiconductor device. The semiconductor device comprises a first semiconductor structure; a second semiconductor structure; an active region between the first semiconductor structure and the second semiconductor structure, wherein the active region comprises multiple alternating well layers and barrier layers, the active region further comprises an upper surface facing the second semiconductor structure and a bottom surface opposite the upper surface; an electron blocking region between the second semiconductor structure and the active region, wherein the electron blocking region comprises a first electron blocking layer having a band gap greater than the band gap of one of the barrier layers; a first aluminum-containing layer between the electron blocking region and the active region, wherein the first aluminum-containing layer has a band gap greater than the band gap of the first electron blocking layer; and a p-type dopant above the bottom surface of the active region and comprising a concentration profile comprising a peak shape having a peak concentration value, wherein the peak concentration value lies at a distance of between 15 nm and 60 nm from the upper surface of the active region.

The present disclosure provides a semiconductor device. The semiconductor device comprises a first semiconductor structure; a second semiconductor structure; an active region between the first semiconductor structure and the second semiconductor structure, wherein the active region comprises multiple alternating well layers and barrier layers; an electron blocking region between the second semiconductor structure and the active region, wherein the electron blocking region comprises a first electron blocking layer having a band gap greater than the band gap of one of the barrier layers; a first aluminum-containing layer between the electron blocking region and the active region, wherein the first aluminum-containing layer has a band gap greater than the band gap of the first electron blocking layer; wherein a distance between the first aluminum-containing layer and the active region is between 3 nm and 20 nm both inclusive.

BRIEF DESCRIPTION OF THE DRAWINGS

The foregoing aspects and many of the attendant advantages of this disclosure will become more readily appreciated as the same becomes better understood by reference to the following detailed description, when taken in conjunction with the accompanying drawings, wherein.

DETAILED DESCRIPTION OF PREFERRED EMBODIMENTS

Figure 1:
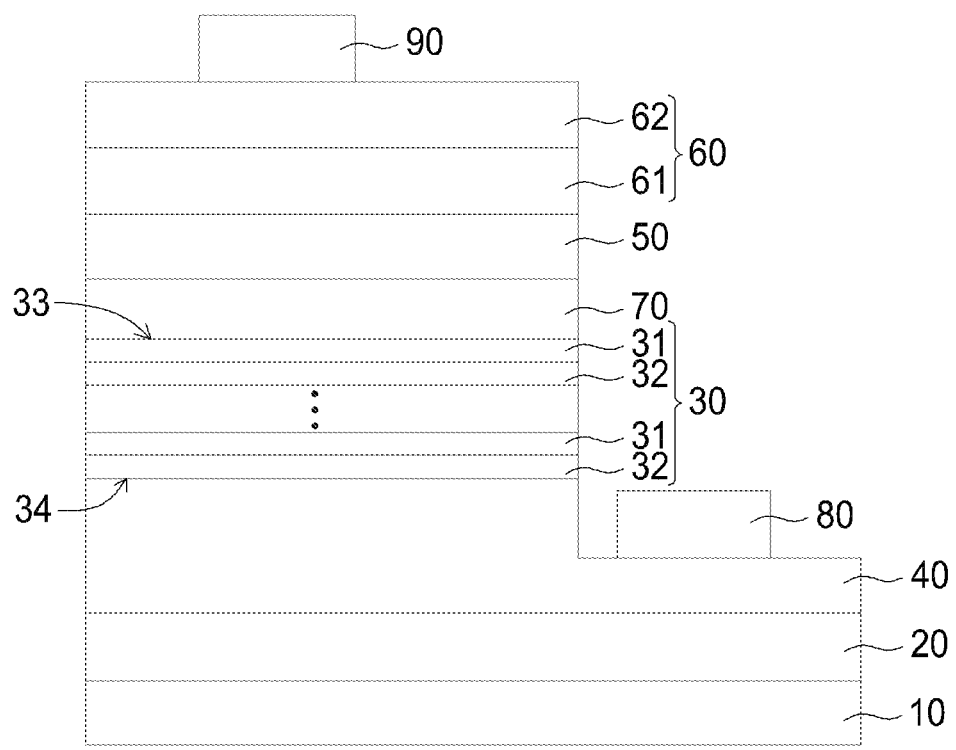
FIG. 1 is a cross-sectional diagram showing a semiconductor device according to a first embodiment of the present disclosure.

Exemplary embodiments of the present disclosure will be described in detail with reference to the accompanying drawings hereafter. The following embodiments are given by way of illustration to help those skilled in the art fully understand the spirit of the present disclosure. Hence, it should be noted that the present disclosure is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

the general expression of AlInP means $Al_xIn_{(1-x)}P$, wherein $0 \le x \le 1$; the general expression of AlGaInP means $(Al_yGa_{(1-y)})_{1-x}In_xP$, wherein $0 \le x \le 1$, $0 \le y \le 1$; the general expression of AlGaN means $Al_xGa_{(1-x)}N$, wherein $0 \le x \le 1$; the general expression of AlAsSb means $AlAs_{(1-x)}Sb_x$ wherein $0 \le x \le 1$ and the general expression of InGaP means $In_xGa_{1-x}P$, wherein $0 \le x \le 1$; the general expression of InGaAsP means $In_xGa_{1-x}As_{1-y}P_y$, wherein $0 \le x \le 1$, $0 \le y \le 1$; the general expression of AlGaAsP means $Al_xGa_{1-x}As_{1-y}P_y$, wherein 0≤x≤1, 0≤y≤1; the general expression of InGaAs means $In_xGa_{1-x}As$, wherein 0≤x≤1; the general expression of InGaN means $In_xGa_{1-x}N$, wherein 0≤x≤1; the general expression of InAlGaN means $In_xAl_yGa_{1-x-y}N$, wherein 0≤x≤1, 0≤y≤1. The content of the element can be adjusted for different purposes, such as, but not limited to adjusting the peak wavelength or the dominant wavelength emitted from the semiconductor device of the present disclosure.

The compositions and dopants of each layer in the semiconductor device of the present disclosure may be determined by any suitable means, such as secondary ion mass spectrometer (SIMS).

The thickness of each layer in the semiconductor device of the present disclosure can be determined by any suitable means, such as transmission electron microscope (TEM) or scanning electron microscope (SEM) to determine the depth position of each layer on the SIMS graph.

In the present disclosure, if not specifically mentioned, the term "peak shape" means a line profile comprising two lines, and specifically, two neighboring lines each comprise a slope, wherein the slopes are with opposite mathematical signs. Specifically, one of the lines is with a positive slope, and the other one is with a negative slope.

In the present disclosure, if not specifically mentioned, the term "peak concentration value" means the highest concentration value between the two lines with slopes with opposite mathematical signs.

Figure 2:
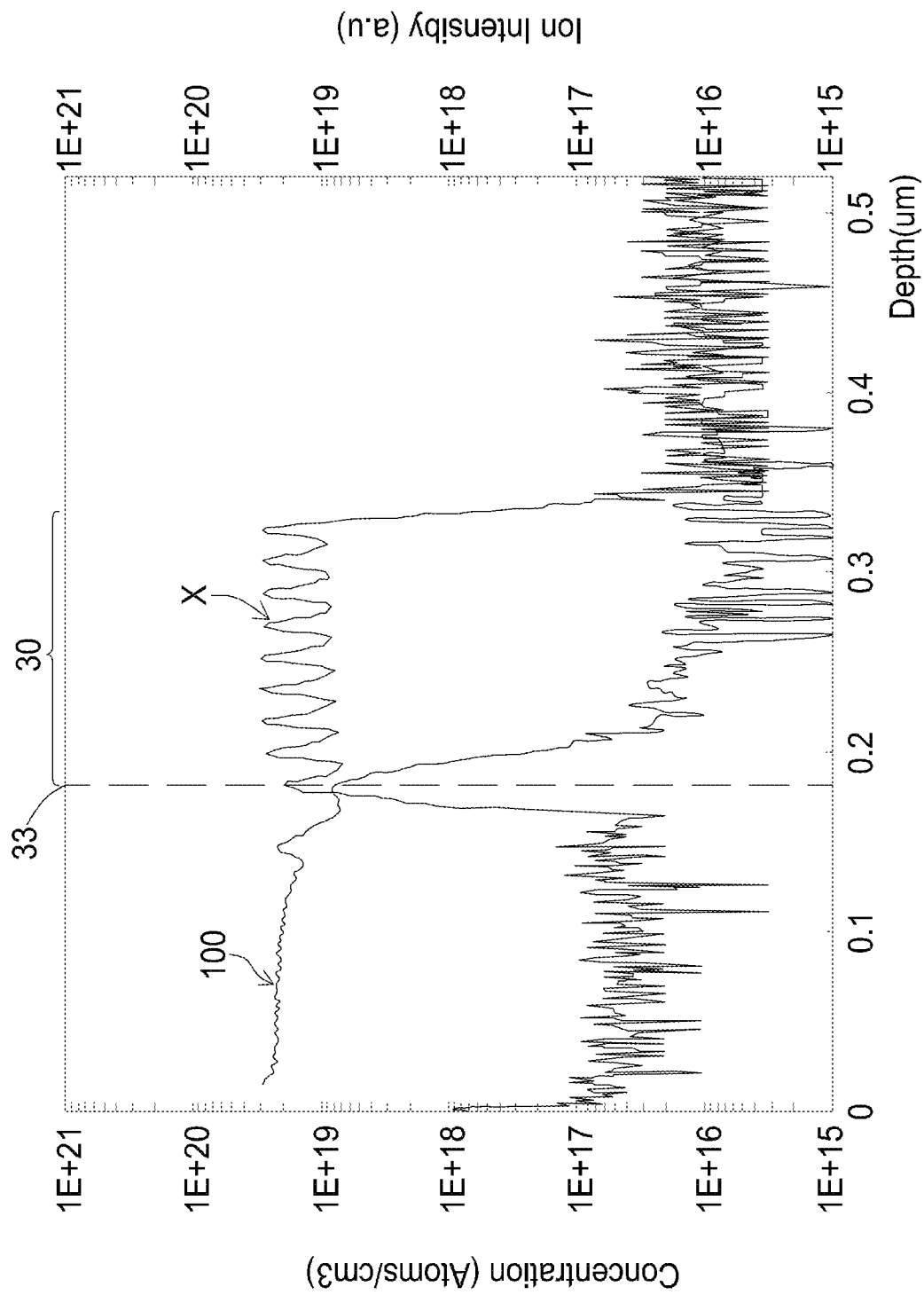
FIG. 2 is a graph showing a relation between the concentration or ion intensity of the elements and the depth in a part of the semiconductor device according to the first embodiment of the present disclosure.

FIG. 1 is a cross-sectional diagram showing a semiconductor device according to a first embodiment of the present disclosure. FIG. 2 is a graph showing a relation between the concentration or ion intensity of the elements and the depth in a part of the semiconductor device according to the first embodiment of the present disclosure, wherein the relation is determined by secondary ion mass spectrometry (SIMS).

The semiconductor device comprises a substrate 10, a buffer layer 20 on the substrate 10, an active region 30 on the buffer layer 20, a first semiconductor structure 40 between the active region 30 and the buffer layer 20, an electron blocking region 50 on the active region 30, a second semiconductor structure 60 on the electron blocking region 50, and a first aluminum-containing layer 70 between the active region 30 and the electron blocking region 50. The semiconductor device further comprises a first electrode 80 and a second electrode 90. The first electrode 80 is electrically connected to the first semiconductor structure 40. The second electrode 90 is electrically connected to the second semiconductor structure 60. The active region 30 comprises an upper surface 33 facing the first aluminum-containing layer 70 and a bottom surface 34 opposite to the upper surface 33. The semiconductor device further comprises a p-type dopant 100 above the bottom surface 34 of the active region 30. More specifically, one or more of the layers above the active region 30 may comprise the p-type dopant 100. In the present embodiment, the p-type dopant 100 is in the second semiconductor structure 60 and in the electron blocking region 50. In the present embodiment, the second semiconductor structure 60 comprises a second semiconductor layer 61 on the electron blocking region 50 and a contact layer 62 on the second semiconductor layer 61. In another embodiment, the second semiconductor structure 60 may comprise a single second semiconductor layer 61 or a single contact layer 62.

The active region 30 comprises multiple alternating well layers 31 and barrier layers 32. Each of the barrier layers 32 has a first band gap. Each of the well layers 31 has a second band gap. In one embodiment, the first band gap of one of the barrier layers 32 is not less than the second band gap of one of the well layers 31, and preferably, is higher than the second band gap of one of the well layers 31. In one embodiment, the first band gap of each of the barrier layers 32 is not less than the second band gap of each of the well layers 31, and preferably, is higher than the second band gap of each of the well layers 31. The well layers 31 comprise Group III-V semiconductor material comprising a Group III element X. In one embodiment, X is indium. In the present embodiment, the well layers 31 comprise $In_aGa_{1-a}N$, wherein 0<a≤1. The barrier layers 32 comprise $Al_bGa_{1-b}N$, wherein 0≤b≤1. In one embodiment, the barrier layers 32 comprise GaN. In another embodiment, 0<b≤0.2. Each of the barrier layers 32 has a thickness. Each of the well layers 31 has a thickness. The thickness of one of the barrier layers 32 is greater than the thickness of one of the well layers 31. Preferably, the thickness of each of the barrier layers 32 is greater than the thickness of each of the well layers 31. Preferably, the thickness of each of the barrier layers 32 is not greater than 20 nm, and more preferably, not less than 3 nm. The thickness of each of the well layers 31 is not greater than 10 nm, and not less than 1 nm. In the present embodiment, all of the barrier layers 32 have substantially the same thickness. All of the well layers 31 have substantially the same thickness. In one embodiment, the well layer 31 closest to the first semiconductor structure 40 comprises the bottom surface 34. In another embodiment, the barrier layer 32 closest to the first semiconductor structure 40 comprises the bottom surface 34. The well layer 31 closest to the electron blocking region 50 comprises the upper surface 33.

Figure 3:
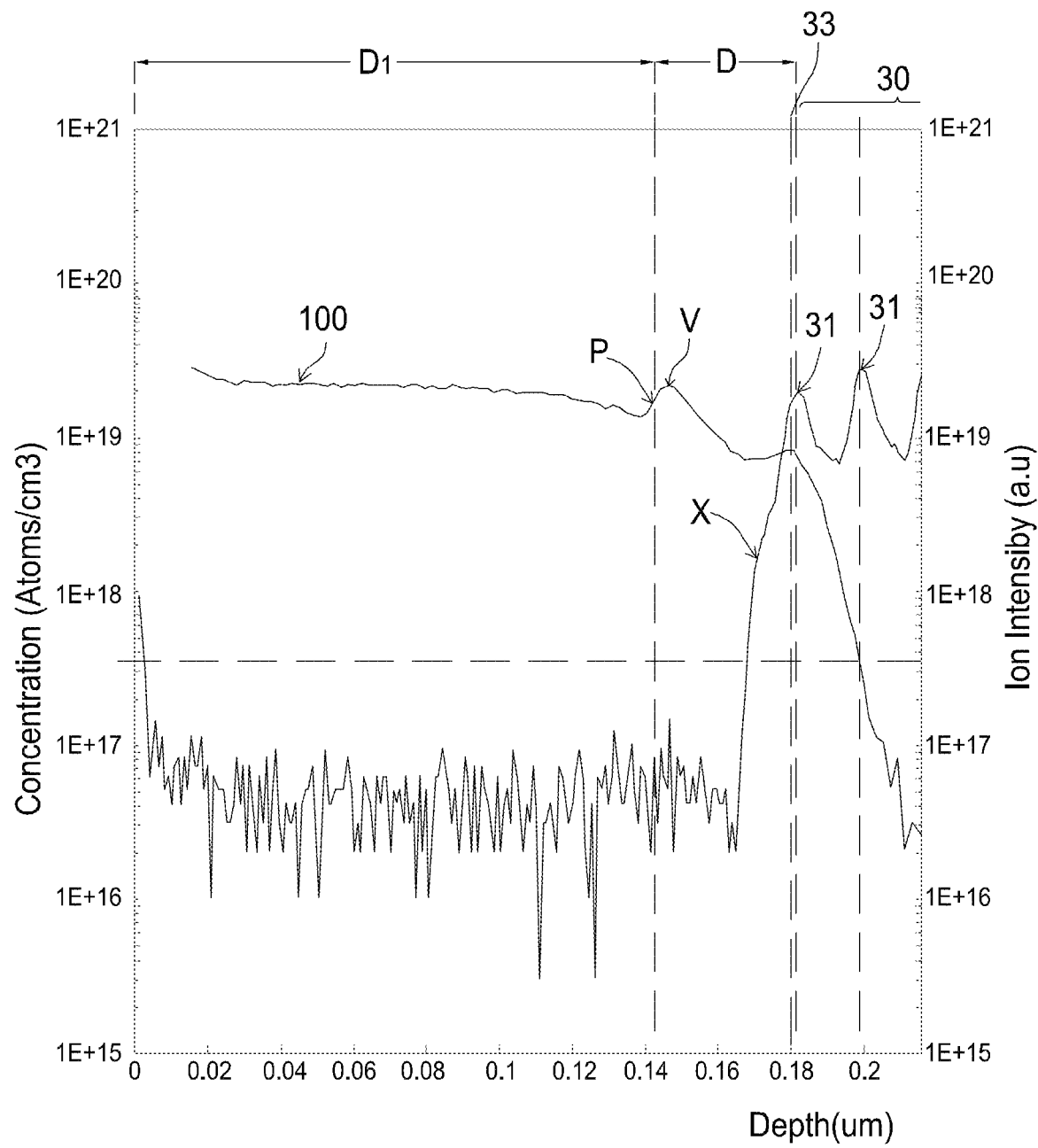
FIG. 3 is an enlarged graph of a part of FIG. 2.

FIG. 3 is an enlarged graph as shown in FIG. 2. The concentration of p-type dopant 100 and the ion intensity of the Group III element X are determined. In the present embodiment, the p-type dopant 100 is Mg. The Group III element X is indium. Some of the elements other than the Group III element X in the semiconductor device are not shown in FIG. 2 and FIG. 3, such as nitrogen (N), gallium (Ga), aluminum (Al) and silicon (Si). Referring to FIG. 3, the position of the upper surface 33 lies at a depth position of about 185 nm. In the present embodiment, a distance between the upper surface 33 of the active region 30 and a topmost semiconductor surface of the semiconductor device is less than 200 nm. In the present disclosure, the topmost semiconductor surface is the top surface of the topmost semiconductor layer in the semiconductor device. In the present embodiment, the topmost semiconductor surface is the top surface of the contact layer 62.

In the present embodiment, the electron blocking region 50 comprises a first electron blocking layer (not shown) having a third band gap greater than the first band gap of one of the barrier layers 32. Preferably, the third band gap is greater than the first band gap of each of the barrier layers 32. In the present embodiment, the electron blocking region 50 comprises a single first electron blocking layer comprising $In_cAl_dGa_{1-c-d}N$, wherein 0≤c≤1, 0≤d≤1, preferably, 0≤c≤0.005, 0<d≤0.5. In another embodiment (not shown), the electron blocking region 50 comprises multiple alternating first electron blocking layers (not shown) and second barriers (not shown), wherein the third energy gap of each of the first electron blocking layers is greater than the energy gap of one of the second barriers. Preferably, the band gap of each of the second barriers is lower than the third band gap of each of the first electron blocking layers. The second barriers comprise $In_eAl_fGa_{1-e-f}N$, wherein 0≤e≤1, 0≤f≤1. Preferably, f<d. A single first electron blocking layer and a single second barrier adjacent the single first electron blocking layer are regarded as a pair. The number of the pair is between 5 and 10. In the present embodiment, the materials of the first electron blocking layers are substantially the same. The materials of the second barriers are substantially the same. The alternating first electron blocking layers and second barriers may further improve the light-emission efficiency of the semiconductor device. In another embodiment, the first electron blocking layers comprise different materials. In one embodiment, the contents of one of the Group III elements in some of consecutive first electron blocking layers are gradually changed along a direction from the active region 30 to the electron blocking region 50. In one embodiment, the Al contents in some of consecutive first electron blocking layers are gradually changed along a direction from the active region 30 to the electron blocking region 50.

The first aluminum-containing layer 70 has a fourth band gap greater than the third band gap of the first electron blocking layer. The first aluminum-containing layer 70 comprises $Al_gGa_{(1-g)}N$, wherein $0.5<g\leq1$, and preferably, $0.7<g\leq1$. In one embodiment, the first aluminum-containing layer 70 comprises AlN. In one embodiment, if the element gallium is shown in a SIMS profile, the Ga intensity at a depth position where the first aluminum-containing layer 70 lies is lower that the Ga ion intensity at a depth position where the active region 30 lies. In the present embodiment, the first aluminum-containing layer 70 has a thickness not less than 0.5 nm, and not greater than 15 nm, more preferably, not greater than 10 nm. The first aluminum-containing layer 70 with a thickness between 0.5 nm and 15 nm is for reducing the amount of the p-type dopant 100 diffusing into the active region 30. If the thickness of the first aluminum-containing layer 70 is less than 0.5 nm, the ability to block the p-type dopant 100 from diffusing into the active region 30 is deteriorated and the electrical static discharge (ESD) tolerance of the semiconductor device is poor. If the thickness of the first aluminum-containing layer 70 is greater than 15 nm, the electrical properties of the semiconductor device such as forward voltage and/or leakage current are worse.

Referring to FIG. 3, the p-type dopant 100 comprises a concentration profile comprising a peak shape P having a peak concentration value V, and the peak concentration value V lies at a distance D of between 15 nm and 60 nm from the upper surface 33 of the active region 30, and more preferably, the peak concentration value V lies at a distance D of between 15 nm and 40 nm from the upper surface 33 of the active region 30. In the present embodiment, the peak concentration value V lies at a distance D of about 36 nm from the upper surface 33 of the active region 30. In the present embodiment, the peak concentration value V lies in the second semiconductor structure 60. The peak concentration value V is greater than $1\times10^{18}/cm^3$, and preferably greater than $1\times10^{19}/cm^3$, and more preferably, not more than $1\times10^{21}/cm^3$. Referring to FIG. 3, the well layer 31 neighboring the well layer 31 closest to the electron blocking region 50, that is, the second well layer 31 from the electron blocking region 50, lies at a depth position of between about 199 and 205 nm. The concentration of the p-type dopant 100 in the well layer adjacent to the well layer closest to the electron blocking region 50 is not more than $1\times10^{18}/cm^3$, and more preferably not more than $6\times10^{17}/cm^3$. In the present embodiment, a distance $D_t$ between the topmost semiconductor surface of the semiconductor device and the peak concentration value V is less than 160 nm, and preferably, between 100 nm and 160 nm.

Figure 4:
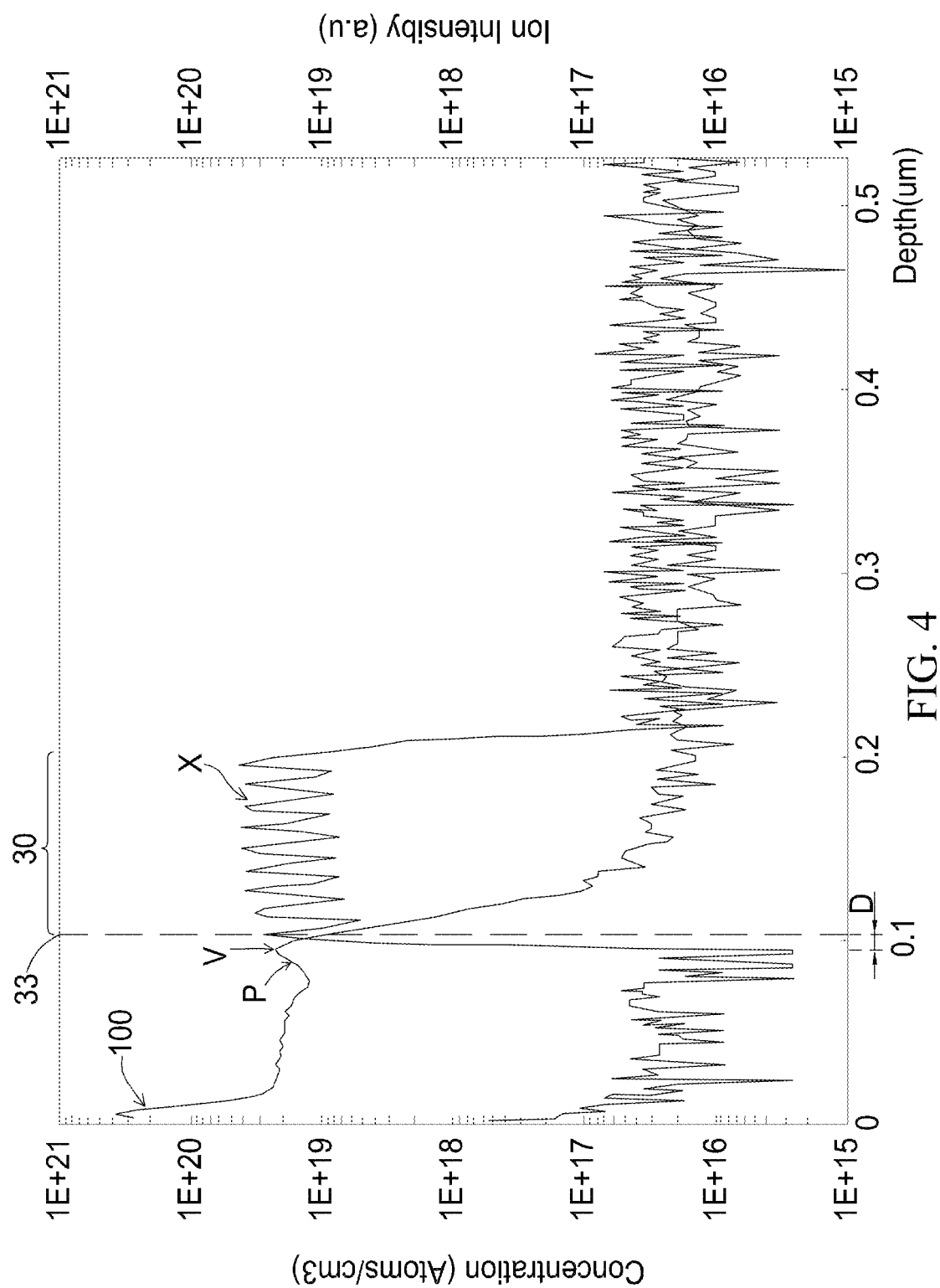
FIG. 4 is a graph showing a relation between the concentration or ion intensity of the elements and the depth in a part of the semiconductor device according to an embodiment of the present disclosure.

FIG. 4 is a graph showing a relation between the concentration or ion intensity of the elements and the depth in a part of the semiconductor device according to an embodiment of the present disclosure, wherein the semiconductor device comprises substantially the same structures as that of the first embodiment while the major difference is that the semiconductor device according to the comparative embodiment is devoid of the first aluminum-containing layer 70 described in the first embodiment and the electron blocking region 50 comprises a single first electron blocking layer. Referring to FIG. 4, the position of the upper surface 33 lies at a depth position of about 102 nm. The peak concentration value V lies at a distance D of less than 15 nm from the upper surface 33 of the active region 30. As a result, the light-emission efficiency of the semiconductor device according to the comparative embodiment is much lower than that of the semiconductor device according to the first embodiment of the present disclosure since the amount of the p-type dopant 100 diffusing into the active region 30 of the semiconductor device according to the comparative embodiment is more than that of the semiconductor device according to the first embodiment. Besides, the electrostatic discharge (ESD) character of the semiconductor device according to the comparative embodiment is worse than that of the semiconductor device according to the first embodiment. If the semiconductor device according to the comparative embodiment is modified to have a total thickness from the upper surface 33 of the active region 30 to the topmost semiconductor surface greater than 200 nm, the semiconductor device according to the comparative embodiment has the same electrostatic discharge tolerance as that of the semiconductor device according to the first embodiment.

In the present disclosure, because the semiconductor device comprises the first aluminum-containing layer 70 and a p-type dopant 100 comprising a peak concentration value V lies at a distance of between 15 nm and 60 nm from the upper surface 33 of the active region 30, the hole injection efficiency of the semiconductor device can be improved while the problem of p-type dopant 100 diffusing into the active region 30 can be alleviated at the same time. Furthermore, the electrical static discharge (ESD) tolerance of the semiconductor device of the present disclosure can be improved. To solve electrical static discharge problems, a conventional semiconductor device may have a larger total thickness of p side layers. However, since the semiconductor device of the present disclosure comprises the first aluminum-containing layer 70 and the p-type dopant 100 comprising the peak concentration value V lies at the distance of between 15 nm and 60 nm from the upper surface 33 of the active region 30 closest to the electron blocking region 50, the electrical static discharge (ESD) tolerance of the semiconductor device of the present disclosure can be improved. As a result, the semiconductor device of the present disclosure is capable of having a thinner total thickness of p side layers compared with a conventional semiconductor device with the same electrical static discharge (ESD) tolerance. That is, in the semiconductor device of the present disclosure, a distance between the upper surface 33 of the active region 30 and a topmost semiconductor surface of the semiconductor device is less than 200 nm, or a distance $D_1$ between the topmost semiconductor surface of the semiconductor device and the peak concentration value V is less than 160 nm.

Figure 5:
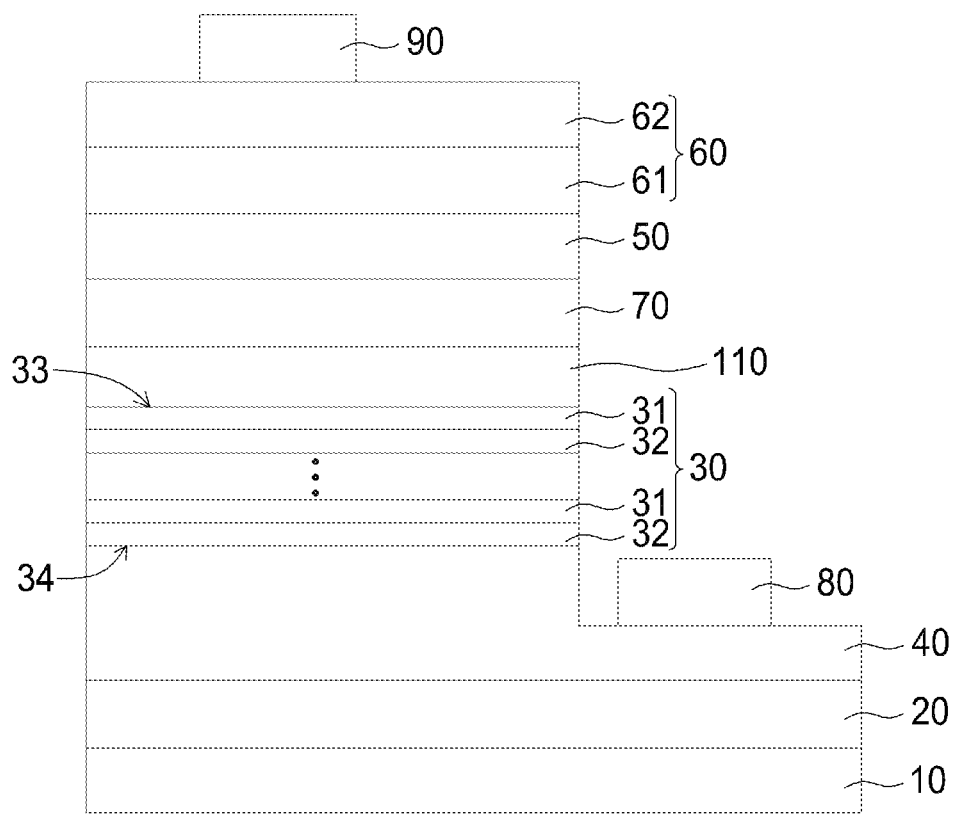
FIG. 5 is a cross-sectional diagram showing a semiconductor device according to a second embodiment of the present disclosure.

FIG. 5 is a cross-sectional diagram showing a semiconductor device according to a second embodiment of the present disclosure. The semiconductor device in accordance with the second embodiment of the present disclosure comprises substantially the same structure as the first embodiment, and the difference is that the semiconductor device in the present embodiment further comprises a second electron blocking layer 110 on a side of the first aluminum-containing layer 70, wherein the second electron blocking layer 110 has a fifth band gap greater than the first band gap of one of the barrier layers 32. Preferably, the fifth band gap of the second electron blocking layer 110 is greater than the first band gap of each of the barrier layers. The fifth band gap of the second electron blocking layer 110 is lower than the fourth band gap of the first aluminum-containing layer 70. In one embodiment, when the electron blocking region 50 comprises alternating first electron blocking layers (not shown) and second barriers (not shown), the fifth band gap of the second electron blocking layer 110 is higher than the band gap of each of the second barriers. In the present embodiment, the first aluminum-containing layer 70 is between the second electron blocking layer 110 and the electron blocking region 50. In another embodiment, the first aluminum-containing layer 70 is between the active region 30 and the second electron blocking layer 110. The second electron blocking layer 110 comprises $In_hAl_iGa_{1-h-i}N$, wherein 0≤h≤1, 0≤i≤1. Preferably, 0<d, i<g≤1. In another embodiment, 0≤h≤0.05, 0<i≤0.3, preferably, 0.05≤i≤0.3. If i is smaller than 0.05, the electrostatic discharge (ESD) character of the semiconductor device is poor. The forward voltage of the semiconductor device increases if i is greater than 0.3. The second electron blocking layer 110 has a thickness between 3 nm and 20 nm. The second electron blocking layer 110 may further improve the light-emission efficiency of the semiconductor device in combination with the first aluminum-containing layer 70 and the electron blocking region 50.

Figure 6:
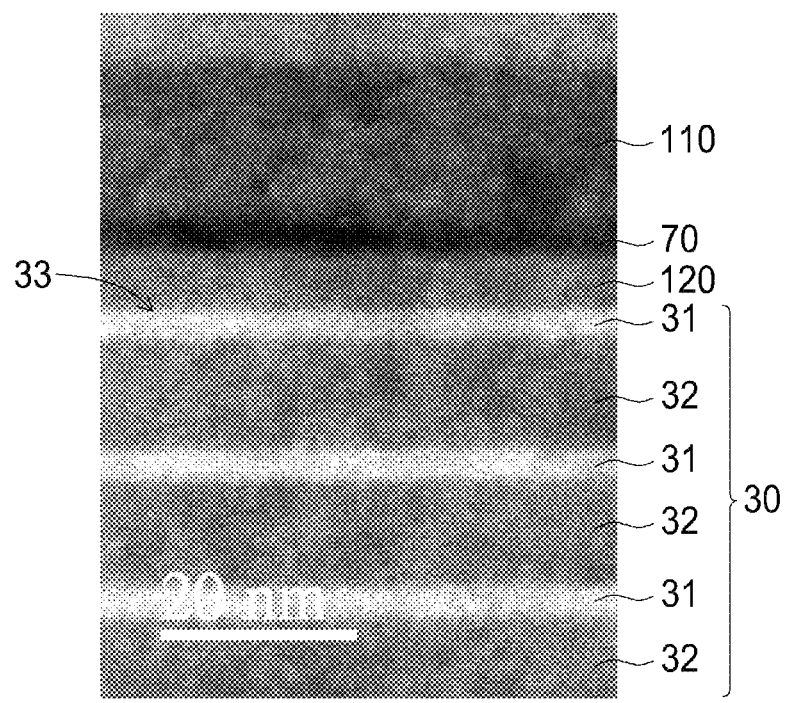
FIG. 6 is a TEM (Transmission electron microscope) image of a part of a semiconductor device according to a third embodiment of the present disclosure.

FIG. 6 is a TEM (Transmission electron microscope) image of a part of a semiconductor device according to a third embodiment of the present disclosure. The semiconductor device in accordance with the third embodiment of the present disclosure comprises substantially the same structure as the second embodiment, and the difference is that the semiconductor device further comprises a confinement layer 120. The confinement layer 120 is between the active region 30 and the first aluminum-containing layer 70. The first aluminum-containing layer 70 is between the active region 30 and the second electron blocking layer 110. In another embodiment, the first aluminum-containing layer 70 is between the second electron blocking layer 110 and the electron blocking region 50. The confinement layer 120 has a thickness smaller than the thickness of one of the barrier layers 32. Preferably, the thickness of the confinement layer 120 is less than the thickness of each of the barrier layers 32. Preferably, the thickness of the confinement layer 120 is not less than 3 nm and not more than 10 nm. The confinement layer 120 with a thickness less than 3 nm may cause a leakage current. The confinement layer 120 comprises $In_jAl_kGa_{(1-j-k)}N$, wherein 0≤j≤1, 0≤k≤1. In one embodiment, the material of the confinement layer 120 is the same as the material of one of the barrier layers 32.

In one embodiment, a distance between the first aluminum-containing layer 70 and the upper surface 33 of the active region 30 is at least 3 nm, and not more than 20 nm. Specifically, the distance between a bottom surface of the first aluminum-containing layer 70 and the upper surface 33 of active region 30 is at least 3 nm, and not more than 20 nm. That is, the first aluminum-containing layer 70 is physically separated from the active region 30. If the distance is less than 3 nm, the amount of the p-type dopant 100 diffusing into the active region 30 increases, which deteriorates the quality of the active region 30. If the distance is greater than 20 nm, the hole injection efficiency is poor. The semiconductor device can comprise any suitable semiconductor layers with total thickness of between 3 nm and 20 nm and between the first aluminum-containing layer 70 and the active region 30. In one embodiment, the confinement layer 120 is between the first aluminum-containing layer 70 and the active region 30 to separate the first aluminum-containing layer 70 and the active region 30 within a distance of between 3 nm and 20 nm. In another embodiment, the second electron blocking layer 110 is between the first aluminum-containing layer 70 and the active region 30 to separate the first aluminum-containing layer 70 and the active region 30 within a distance of between 3 nm and 20 nm. In another embodiment, the confinement layer 120 and the second electron blocking layer 110 are both between the first aluminum-containing layer 70 and the active region 30 to separate the first aluminum-containing layer 70 and the active region 30 within a distance of between 3 nm and 20 nm.

Figure 7:
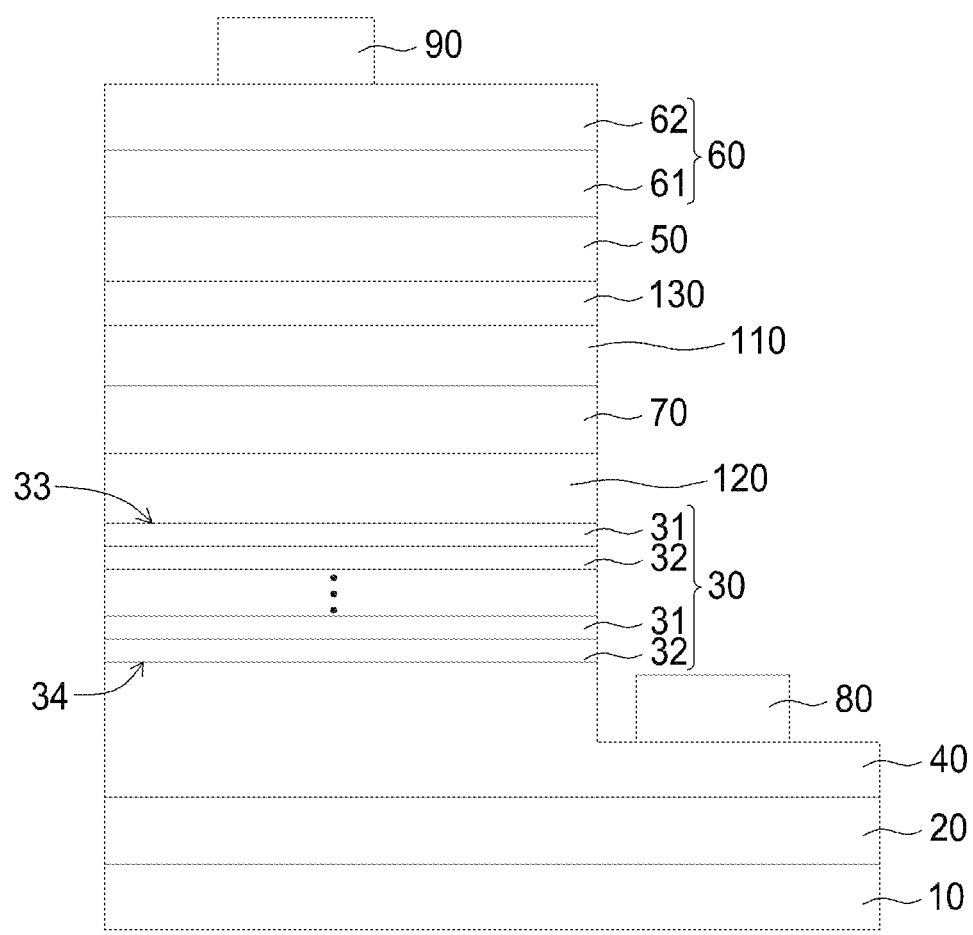
FIG. 7 is a cross-sectional diagram showing a semiconductor device according to a fourth embodiment of the present disclosure.
Figure 8:
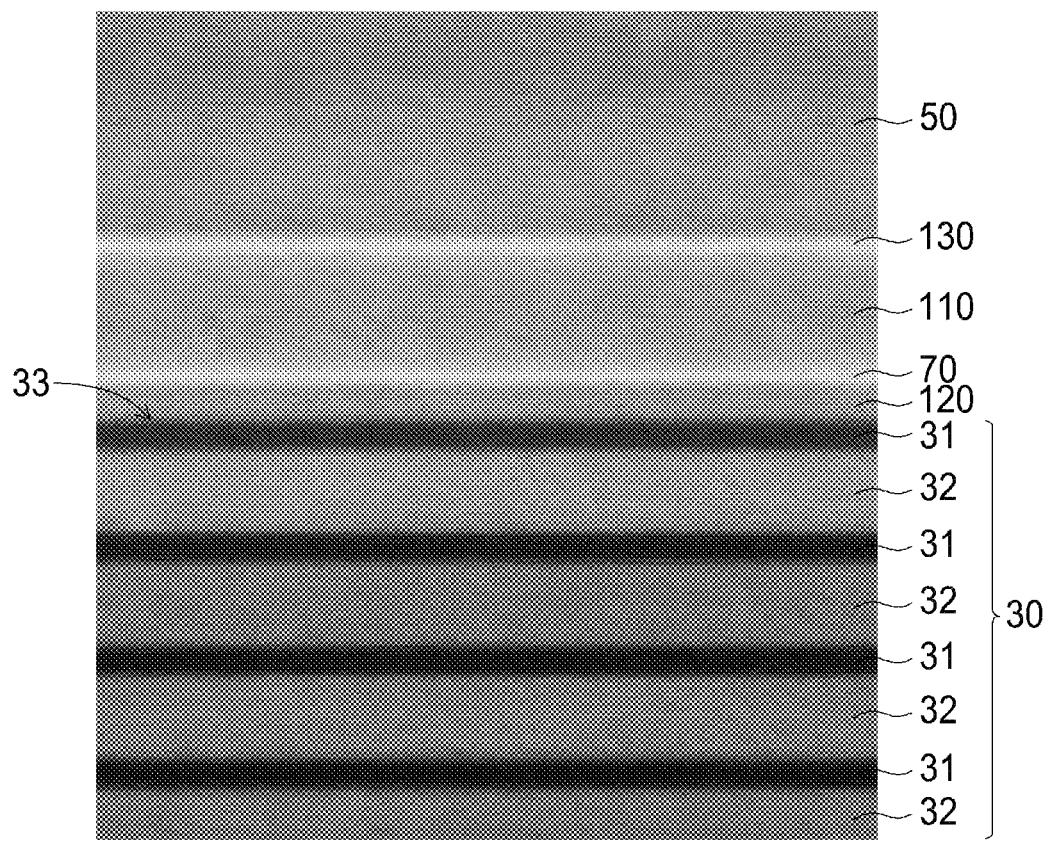
FIG. 8 is a TEM (Transmission electron microscope) image of a part of the semiconductor device according to the fourth embodiment of the present disclosure.

FIG. 7 is a cross-sectional diagram showing a semiconductor device according to a fourth embodiment of the present disclosure. FIG. 8 is a TEM (Transmission electron microscope) image of a part of the semiconductor device according to the fourth embodiment of the present disclosure. The semiconductor device in accordance with the fourth embodiment of the present disclosure comprises substantially the same structure as the third embodiment, and the difference is that the semiconductor device in the present embodiment further comprises a second aluminum-containing layer 130 on a side of the second electron blocking layer 110 opposite to the first aluminum-containing layer 70, wherein the second aluminum-containing layer 130 has a sixth band gap greater than a fifth band gap of the second electron blocking layer 110. The second aluminum-containing layer 130 comprises $Al_mGa_{(1-m)}N$, wherein 0.5<m≤1, and preferably, 0.7<m≤1. Preferably, 0<d, i<g, m≤1. In one embodiment, the second aluminum-containing layer 130 comprises AlN. In one embodiment, the second aluminum-containing layer 130 and the first aluminum-containing layer 70 comprise the same material. The second aluminum-containing layer 130 has a thickness between 0.5 nm and 15 nm both inclusive. A ratio of the thickness of the second aluminum-containing layer 130 to the thickness of the first aluminum-containing layer 70 is between 0.8 and 1.2.

Figure 9:
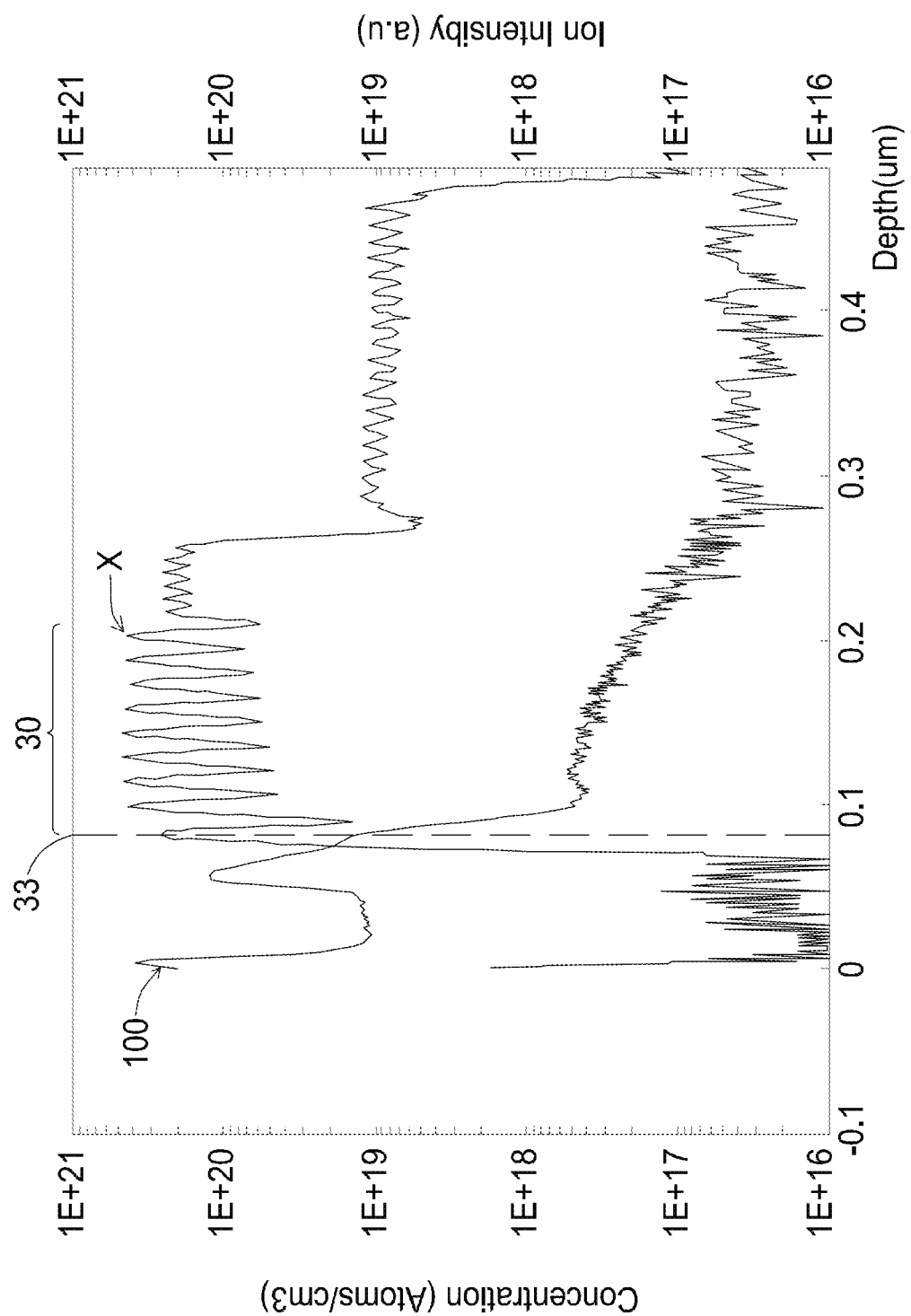
FIG. 9 is a graph showing a relation between the concentration or ion intensity of the elements and the depth in a part of the semiconductor device according to the fourth embodiment of the present disclosure.
Figure 10:
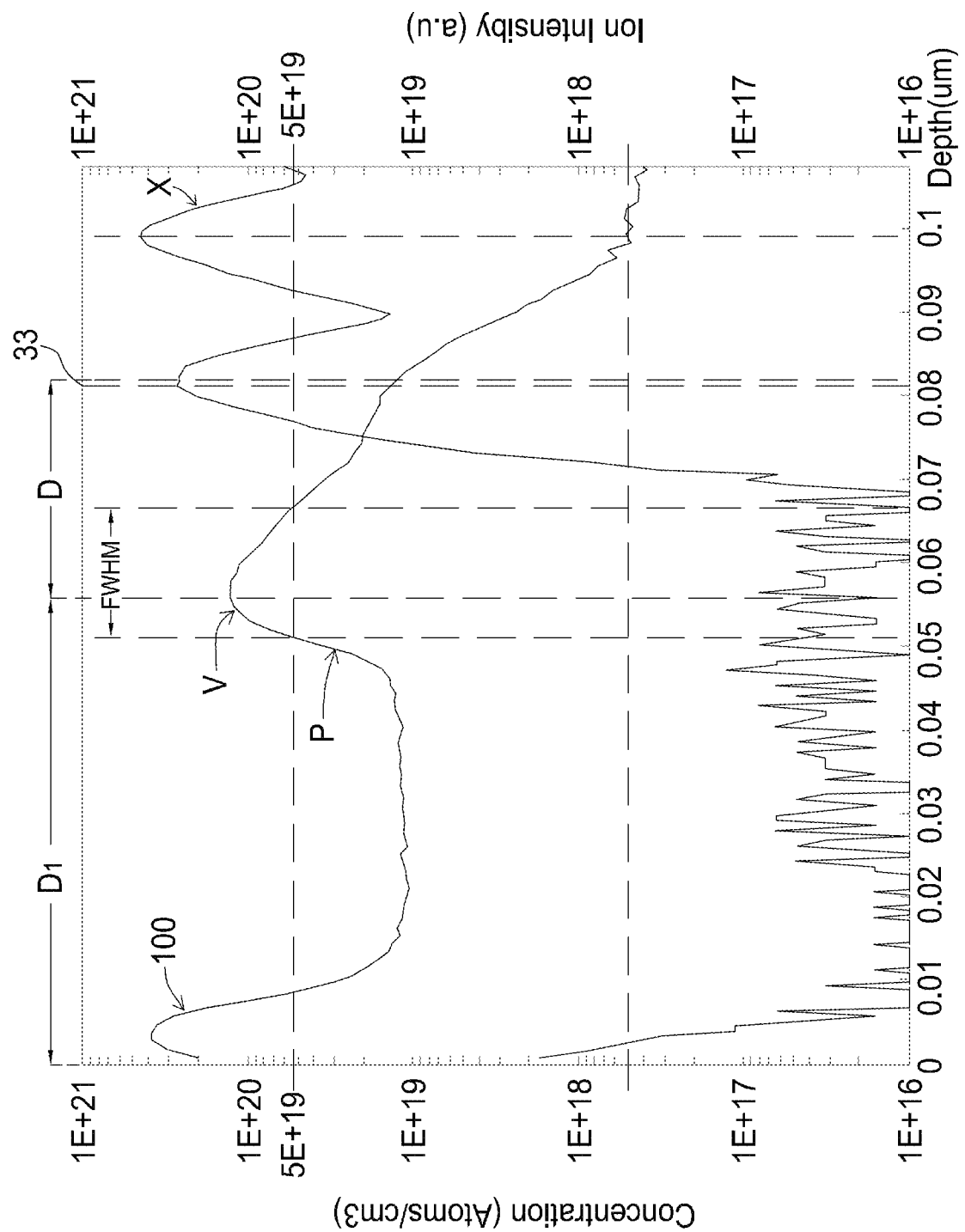
FIG. 10 is an enlarged graph of a part of FIG. 9.

FIG. 9 is a graph showing a relation between the concentrations or ion intensity of the elements and the depth in a part of the semiconductor device according to the fourth embodiment of the present disclosure, wherein the concentration of p-type dopant 100 and the ion intensity of the Group III element X are determined. FIG. 10 is an enlarged graph of a part of FIG. 9. In the present embodiment, the p-type dopant 100 is Mg. The Group III element X is indium. Some of the elements in the semiconductor device are not shown in FIG. 9 and FIG. 10, such as nitrogen (N), gallium (Ga), aluminum (Al) and silicon (Si). In the present embodiment, the upper surface 33 of the active region 30 lies at a depth position of about 82 nm. As mentioned in the first embodiment, the p-type dopant 100 comprises a concentration profile comprising a peak shape P having a peak concentration value V. The peak concentration value V lies at a distance D of between 15 nm and 60 nm from the upper surface 33 of the active region 30. In the present embodiment, the peak concentration value V lies at a distance D of about 28 nm from the upper surface 33 of the active region 30. In the present embodiment, the peak concentration value V lies in the electron blocking region 50. Referring to FIG. 10, the well layer 31 neighboring the well layer 31 closest to the electron blocking region 50 lies at a depth position of between about 97 and 102 nm. The concentration of the p-type dopant 100 in the well layer 31 neighboring the well layer 31 closest to the electron blocking region 50 is not more than $1\times10^{18}/cm^3$, and more preferably not more than $6\times10^{17}/cm^3$. In the present embodiment, a distance $D_i$ between the topmost semiconductor surface of the semiconductor device and the peak concentration value V is less than 100 nm, and preferably, between 30 nm and 80 nm. Referring to FIG. 10, the peak concentration value V is greater than $1\times10^{18}/cm^3$, and preferably, greater than $1\times10^{19}/cm^3$. In the present embodiment, the peak concentration value V is about $1\times10^{20}/cm^3$. Besides, the peak shape P comprises a full width at half maximum (FWHM) between 5 nm and 50 nm both inclusive, and more preferably between 10 nm and 30 nm both inclusive. In the present embodiment, the FWHM is about 18 nm. In the present embodiment, since the peak concentration value V is about $1\times10^{20}/cm^3$, the FWHM is the width of the peak shape P at the concentration of about $5\times10^{19}/cm^3$.

In the present embodiment, by comprising a first aluminum-containing layer 70 and a second aluminum-containing layer 130 at the same time, the p-type dopant 100 can be more concentrated at a region nearer the active region 30 and with neither seriously diffusing toward the topmost semiconductor surface of the semiconductor device nor seriously diffusing toward the active region 30. As a result, the full width at half maximum of the peak shape P can be between 5 nm and 50 nm, which further enhances the hole injection efficiency. The semiconductor device of the present disclosure is with improved electrostatic discharge (ESD) character since the semiconductor device comprises the first and the second aluminum-containing layer 130 at the same time. In the present embodiment, since the semiconductor device of the present disclosure is with improved electrostatic discharge character, a p-side region of the semiconductor device may be thinner compared with that of a semiconductor device without comprising a first aluminum-containing layer 70 and a second aluminum-containing layer 130. That is, in the present embodiment, the distance $D_1$ between the topmost semiconductor surface of the semiconductor device and the peak concentration value V is less than 100 nm.

Figure 11:
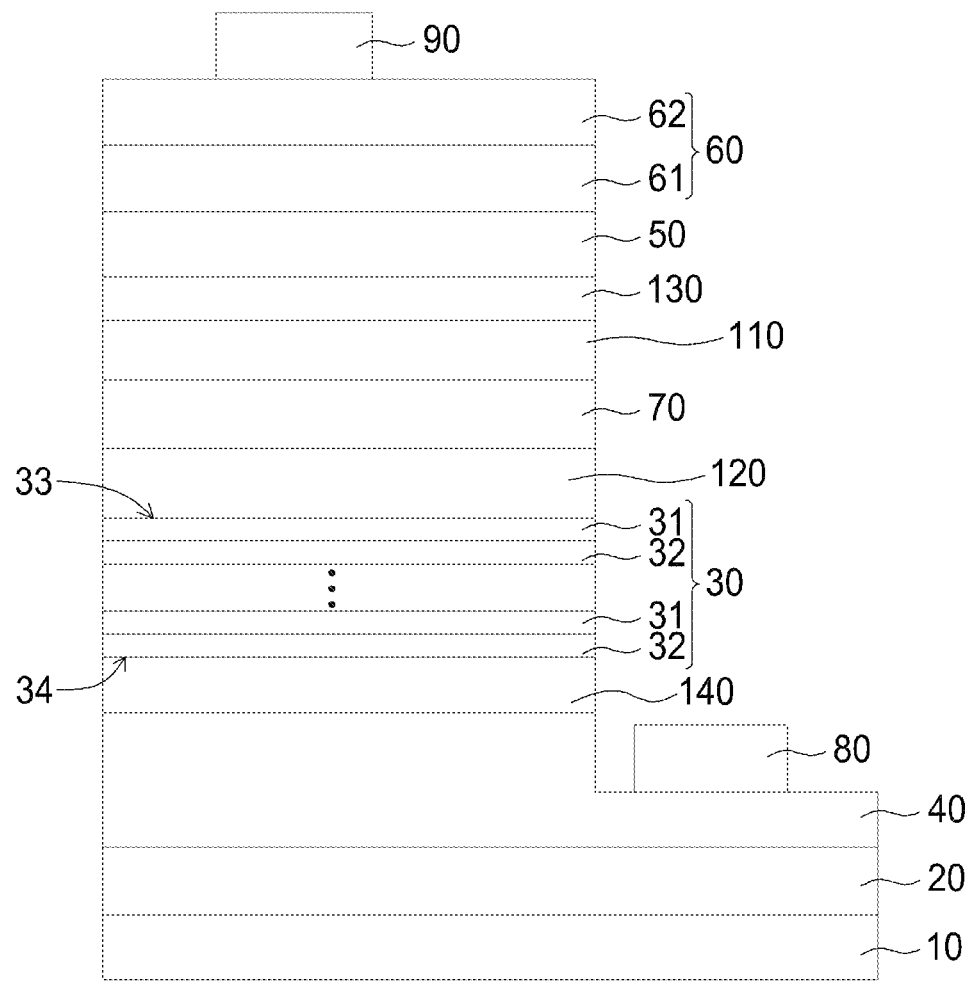
FIG. 11 is a cross-sectional diagram showing a semiconductor device according to a fifth embodiment of the present disclosure.

FIG. 11 is a cross-sectional diagram showing a semiconductor device according to a fifth embodiment of the present disclosure. The semiconductor device in accordance with the fifth embodiment of the present disclosure comprises substantially the same structure as the fourth embodiment, and the difference is that the semiconductor device in the present embodiment further comprises a semiconductor stack 140 between the active region 30 and the first semiconductor structure 40. The semiconductor stack 140 comprises multiple alternating third semiconductor layers (not shown) and fourth semiconductor layers (not shown), wherein a single third semiconductor layer and a single fourth semiconductor layer adjacent to the single third semiconductor layer are considered as a pair. The third semiconductor layers and the fourth semiconductor layers comprise Group III-V semiconductor material. The band gap of the third semiconductor layer is greater than the band gap of the fourth semiconductor layer in the same pair. The third semiconductor layers comprise $In_nGa_{1-n}N$, wherein $0 \leq n \leq 1$, and the fourth semiconductor layer comprise $In_pGa_{1-p}N$, wherein $0 < p \leq 1$. In one embodiment, the third semiconductor layers comprise GaN. In one embodiment, each of the fourth semiconductor layers comprises a Group III element with a highest content, and the highest content of the fourth semiconductor layer closer to the active region 30 is higher than the highest content of the fourth semiconductor layer farther from the active region 30. In the present embodiment, the Group III element comprises indium (In). Specifically, the indium content in a part of one of the fourth semiconductor layers is gradually changed in a direction toward the active region 30. Preferably, the indium content in a part of one of the fourth semiconductor layers is gradually increased in a direction toward the active region 30. In one embodiment, the highest content of indium in the fourth semiconductor layer near the active region 30 is higher than the highest indium content of the fourth semiconductor layer near the substrate 10. As a result, the highest contents of indium in the fourth semiconductor layers are gradually increased in a direction toward the active region 30. The semiconductor device of the present embodiment comprising the semiconductor stack 140 with gradient content of indium can further improve the light-emission efficiency. Furthermore, along with the first aluminum-containing layer 70 and/or the second aluminum-containing layer 130, the light-emission efficiency and the ESD of the semiconductor device of the present disclosure are improved while without affecting the forward voltage and the leakage current.

The semiconductor device of the present disclosure comprises a light-emitting diode, a laser or a power device. In one embodiment, the semiconductor device comprises a light-emitting diode. The peak wavelength emitted from the semiconductor device of the present disclosure is in a visible or invisible range, and preferably, in a blue or ultraviolet range. Preferably, the peak wavelength is between 300 nm and 500 nm, and preferably, between 350 nm and 480 nm. In one embodiment, the laser is a vertical-cavity surface emitting laser (VCSEL).

In one embodiment, the first electrode 80 and the second electrode 90 may be on the two opposite sides of the substrate 10 respectively. In the present embodiment, the substrate 10 may comprise conductive material.

The substrate 10 has a thickness thick enough for supporting the layers or structures thereon, for example, greater than 100 µm, and more preferably, not more than 300 µm. In one embodiment, the substrate 10 comprises sapphire with protrusions periodically formed on a surface thereof. In another embodiment, the substrate 10 comprises conductive material comprising Si, Ge, Cu, Mo, MoW, AlN, ZnO or CuW.

The buffer layer 20 is for reducing dislocations and improving quality of the layers epitaxially grown thereon. The buffer layer 20 comprises $Al_tGa_{1-t}N$, wherein $0 \leq t \leq 1$. In one embodiment, the buffer layer 20 comprises GaN. In another embodiment, the buffer layer 20 comprises AlN. The buffer layer may be formed by physical vapor deposition (PVD) or epitaxy.

In one embodiment, the first semiconductor structure 40 comprises a first semiconductor layer comprising $Al_qGa_{1-q}N$, wherein $0 \leq q \leq 1$. In one embodiment, the first semiconductor layer comprises n-type GaN. In another embodiment, $0 < q \leq 0.1$, for improving the light-emission efficiency. The first semiconductor layer has a thickness not less than 100 nm, and preferably not more than 3000 nm. The concentration of the n-type dopant in the first semiconductor layer is greater than $1\times10^{18}/cm^3$, and preferably, greater than $5\times10^{18}/cm^3$, and more preferably, between $5\times10^{18}/cm^3$ and $5\times10^{21}/cm^3$ both inclusive. The n-type dopant can be, but is not limited to Si. In another embodiment, the first semiconductor structure 40 comprises another semiconductor layer having a conductivity type the same as that of the first semiconductor layer.

The first electrode 80 and the second electrode 90 are for electrically connecting to an external power source and for conducting a current therebetween. The material of the first electrode 80 and the second electrode 90 comprise transparent conductive material or metal material, wherein the transparent conductive material comprises transparent conductive oxide comprising indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO), zinc oxide (ZnO), or indium zinc oxide (IZO). The metal material comprises Au, Pt, GeAuNi, Ti, BeAu, GeAu, Al, or ZnAu, Ni.

The concentration of the p-type dopant 100 in the contact layer 62 is greater than $1\times10^{18}/cm^3$, and preferably, greater than $1\times10^{19}/cm^3$, and more preferably, between $1\times10^{19}/cm^3$ and $5\times10^{22}/cm^3$ both inclusive. The material of the contact layer 62 comprises a Group III-V semiconductor material, such as $Al_rGa_{1-r}N$, wherein $0 \leq r \leq 1$. In one embodiment, $0 < r \leq 0.1$, and preferably, $0 < r \leq 0.05$ for improving the light-emission efficiency. In another embodiment, the contact layer 62 comprises GaN. The contact layer 62 has a thickness not more than 15 nm, and preferably, greater than 3 nm.

The second semiconductor layer 61 comprises a Group III-V semiconductor material, such as $Al_sGa_{1-s}N$, wherein $0 \leq s \leq 1$. In one embodiment, the second semiconductor layer 61 comprises GaN. The second semiconductor layer 61 has a thickness greater than that of the contact layer 62. The thickness of the second semiconductor layer 61 is greater than 20 nm, and preferably, not more than 300 nm. The concentration of the p-type dopant 100 in the second semiconductor layer 61 is lower than that in the contact layer 62. Preferably, the concentration of the p-type dopant 100 in the second semiconductor layer 61 is greater than $1\times10^{17}/cm^3$, and preferably, not more than $1\times10^{22}/cm^3$.

The method of performing epitaxial growth comprises, but is not limited to metal-organic chemical vapor deposition (MOCVD), hydride vapor phase epitaxy (HVPE), molecular beam epitaxy (MBE), or liquid-phase epitaxy (LPE).

In accordance with a further embodiment of the present disclosure, the structures in the embodiments of the present disclosure can be combined or changed. For example, the semiconductor device as shown in FIG. 2 comprises the semiconductor stack 140.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A semiconductor device, comprising:
   a first semiconductor structure;
   a second semiconductor structure on the first semiconductor structure;
   an active region between the first semiconductor structure and the second semiconductor structure, wherein the active region comprises multiple alternating well layers and barrier layers, wherein each of the barrier layers has a band gap, the active region further comprises an upper surface facing the second semiconductor structure and a bottom surface opposite the upper surface;
   an electron blocking region between the second semiconductor structure and the active region, wherein the electron blocking region comprises a first electron blocking layer having a band gap greater than the band gap of one of the barrier layers;
   a first aluminum-containing layer between the electron blocking region and the active region, wherein the first aluminum-containing layer has a band gap greater than the band gap of the electron blocking region;
   a p-type dopant above the bottom surface of the active region and comprising a concentration profile comprising a peak shape having a peak concentration value, wherein the peak concentration value lies in the electron blocking region and at a distance of between 15 nm and 60 nm from the upper surface of the active region; and
   a second electron blocking layer between the active region and the electron blocking region and on a side of the first aluminum-containing layer opposite to the electron blocking region,
   wherein the first aluminum-containing layer comprises a thickness between 0.5 nm and 15 nm both inclusive, and
   wherein the second electron blocking layer has a band gap greater than the band gap of one of the barrier layers.

2. The semiconductor device according to claim 1, further comprising a second aluminum-containing layer on a side of the second electron blocking layer opposite to the first aluminum-containing layer, wherein the second aluminum-containing layer has a band gap greater than the band gap of the second electron blocking layer.

3. The semiconductor device according to claim 2, wherein the second aluminum-containing layer comprises a thickness between 0.5 nm and 15 nm both inclusive.

4. The semiconductor device according to claim 3, wherein a ratio of the thickness of the second aluminum-containing layer to the thickness of the first aluminum-containing layer is between 0.8 and 1.2.

5. The semiconductor device according to claim 3, wherein the peak shape comprises a full width at half maximum (FWHM) between 5 nm and 50 nm both inclusive.

6. The semiconductor device according to claim 2, wherein the first electron blocking layer comprises $In_aAl_bGa_{1-a-b}N$, the second electron blocking layer comprises $In_cAl_dGa_{1-c-d}N$, the first aluminum-containing layer comprises $Al_eGa_{(1-e)}N$, the second aluminum-containing layer comprises $Al_fGa_{(1-f)}N$, wherein $0<b<e\leq 1$, $0<b<f\leq 1$, $0<d<e\leq 1$, $0<d<f\leq 1$.

7. The semiconductor device according to claim 6, wherein $0.7<e\leq 1$, and $0.7<f\leq 1$.

8. The semiconductor device according to claim 1, wherein a distance between the first aluminum-containing layer and the upper surface of the active region is at least 3 nm.

9. The semiconductor device according to claim 1, further comprising a semiconductor stack between the active region and the first semiconductor structure, wherein the semiconductor stack comprises alternating first semiconductor layers and second semiconductor layers.

10. The semiconductor device according to claim 9, wherein each of the second semiconductor layers comprises a Group III element with a highest content, and the highest content of the second semiconductor layer closer to the active region is higher than the highest content of the second semiconductor layer farther from the active region.

11. The semiconductor device according to claim 1, wherein the first electron blocking layer comprises $In_aAl_bGa_{1-a-b}N$, the first aluminum-containing layer comprises $Al_eGa_{(1-e)}N$, and $0.5 < b < e \leq 1$.

12. The semiconductor device according to claim 11, wherein the first aluminum-containing layer comprises AlN.

13. The semiconductor device according to claim 1, further comprising a topmost semiconductor surface, a distance between the topmost semiconductor surface and the peak concentration value is less than 160 nm.

14. The semiconductor device according to claim 1, further comprising a confinement layer between the active region and the first aluminum-containing layer, wherein the confinement layer has a thickness less than the thickness of one of the barrier layers and/or wherein the confinement layer has a thickness not less than 3 nm.

15. The semiconductor device according to claim 1, wherein the peak concentration value lies at a distance of between 15 nm and 40 nm from the upper surface of the active region.

16. The semiconductor device according to claim 1, wherein the concentration of the p-type dopant in the well layer neighboring the well layer closest to the electron blocking region is not more than $1 \times 10^{18}/cm^3$.

17. The semiconductor device according to claim 1, wherein the concentration of the p-type dopant in the well layer neighboring the well layer closest to the electron blocking region is not more than $6 \times 10^{17}/cm^3$.

18. The semiconductor device according to claim 1, wherein the electron blocking region comprises multiple first electron blocking layers and second barriers alternating with the first electron blocking layers, wherein the energy gap of each of the first electron blocking layers is greater than the energy gap of one of the second barriers.

19. A semiconductor device, comprising:
a first semiconductor structure;
a second semiconductor structure on the first semiconductor structure;
an active region between the first semiconductor structure and the second semiconductor structure, wherein the active region comprises multiple alternating well layers and barrier layers, wherein each of the barrier layers has a band gap, the active region further comprises an upper surface facing the second semiconductor structure and a bottom surface opposite the upper surface;
an electron blocking region between the second semiconductor structure and the active region, wherein the electron blocking region comprises a first electron blocking layer having a band gap greater than the band gap of one of the barrier layers;
a first aluminum-containing layer between the electron blocking region and the active region, wherein the first aluminum-containing layer has a band gap greater than the band gap of the electron blocking region;
a p-type dopant above the bottom surface of the active region and comprising a concentration profile comprising a peak shape having a peak concentration value, wherein the peak concentration value lies in the electron blocking region and at a distance of between 15 nm and 60 nm from the upper surface of the active region; and
a semiconductor stack between the active region and the first semiconductor structure, wherein the semiconductor stack comprises alternating first semiconductor layers and second semiconductor layers,
wherein each of the second semiconductor layers comprises a Group III element with a highest content, and the highest content of the second semiconductor layer closer to the active region is higher than the highest content of the second semiconductor layer farther from the active region.

* * * * *